United States Patent
Nitta et al.

(10) Patent No.: US 11,869,767 B2
(45) Date of Patent: Jan. 9, 2024

(54) GALLIUM NITRIDE VAPOR PHASE EPITAXY APPARATUS USED IN VAPOR PHASE EPITAXY NOT USING ORGANIC METAL AS A GALLIUM RAW MATERIAL AND MANUFACTURING METHOD THEREFOR

(71) Applicant: NATIONAL UNIVERSITY CORPORATION TOKAI NATIONAL HIGHER EDUCATION AND RESEARCH SYSTEM, Nagoya (JP)

(72) Inventors: Shugo Nitta, Nagoya (JP); Kazuki Onishi, Nagoya (JP); Yuki Amano, Nagoya (JP); Naoki Fujimoto, Nagoya (JP); Hiroshi Amano, Nagoya (JP)

(73) Assignee: NATIONAL UNIVERSITY CORPORATION TOKAI NATIONAL HIGHER EDUCATION AND RESEARCH SYSTEM, Nagoya (JP)

( * ) Notice: Subject to any disclaimer, the term of this patent is extended or adjusted under 35 U.S.C. 154(b) by 0 days.

(21) Appl. No.: 17/799,083

(22) PCT Filed: Nov. 24, 2020

(86) PCT No.: PCT/JP2020/043681
§ 371 (c)(1),
(2) Date: Aug. 11, 2022

(87) PCT Pub. No.: WO2021/161613
PCT Pub. Date: Aug. 19, 2021

(65) Prior Publication Data
US 2023/0073332 A1 Mar. 9, 2023

(30) Foreign Application Priority Data
Feb. 14, 2020 (JP) ................... 2020-023651

(51) Int. Cl.
*C30B 25/16* (2006.01)
*H01L 21/02* (2006.01)
(Continued)

(52) U.S. Cl.
CPC .......... *H01L 21/0254* (2013.01); *C30B 25/08* (2013.01); *C30B 25/10* (2013.01);
(Continued)

(58) Field of Classification Search
CPC ......... C30B 25/00; C30B 25/02; C30B 25/08; C30B 25/10; C30B 25/12; C30B 25/14;
(Continued)

(56) References Cited

U.S. PATENT DOCUMENTS

| 5,079,184 A | 1/1992 | Hatano et al. |
| 2004/0026704 A1 | 2/2004 | Nikolaev et al. |

(Continued)

FOREIGN PATENT DOCUMENTS

| CN | 103320763 A | 9/2013 |
| CN | 109411329 A | 3/2019 |

(Continued)

OTHER PUBLICATIONS

Osburn, et al. publication entitled "Electrical properties of single crystals, bicrystals, and polycrystals of MgO," Journal of the American Ceramic Society, vol. 54, No. 9, pp. 428-435 (1971). (Year: 1971).*

(Continued)

*Primary Examiner* — Kenneth A Bratland, Jr.
(74) *Attorney, Agent, or Firm* — Miles & Stockbridge P.C.

(57) ABSTRACT

A gallium nitride vapor phase epitaxy apparatus capable of doping magnesium is provided. The apparatus is used in vapor phase epitaxy not using organic metal as a gallium raw material. The apparatus comprises a reactor vessel and a (Continued)

wafer holder. The apparatus comprises a first raw material gas supply pipe configured to supply a first raw material gas containing gallium. The apparatus comprises a second raw material gas supply pipe configured to supply a second raw material gas, which contains nitrogen and configured to react with the first raw material gas. The apparatus comprises a third raw material gas supply pipe configured to supply a third raw material gas containing magnesium. The third raw material gas supply pipe is configured capable of placing a magnesium-based oxide on its supply path. The apparatus comprises a first heating unit configured to heat the magnesium-based oxide in a first temperature range.

13 Claims, 3 Drawing Sheets (51) Int. Cl.
*C30B 25/08* (2006.01)
*C30B 25/10* (2006.01)
*C30B 25/12* (2006.01)
*C30B 25/18* (2006.01)
*C30B 29/40* (2006.01)

(52) U.S. Cl.
CPC .............. *C30B 25/12* (2013.01); *C30B 25/18* (2013.01); *C30B 29/406* (2013.01); *H01L 21/0262* (2013.01); *H01L 21/02579* (2013.01)

(58) Field of Classification Search
CPC ....... C30B 25/16; C30B 25/165; C30B 25/18; C30B 29/00; C30B 29/10; C30B 29/40; C30B 29/403; C30B 29/406; C30B 35/00; C30B 35/002; C23C 16/00; C23C 16/22; C23C 16/30; C23C 16/301; C23C 16/303; C23C 16/44; C23C 16/448; C23C 16/4481; C23C 16/455; C23C 16/45561; C23C 16/45563; C23C 16/45576

USPC .......... 117/84, 88–89, 93, 99, 101–102, 105, 117/200, 204, 937, 952
See application file for complete search history.

(56) References Cited

U.S. PATENT DOCUMENTS

| 2008/0042160 | A1 | 2/2008 | Shibata |
| 2013/0247817 | A1 | 9/2013 | Konno et al. |
| 2020/0270767 | A1 | 8/2020 | Nitta et al. |
| 2021/0310154 | A1* | 10/2021 | Nitta ..................... C23C 16/303 |

FOREIGN PATENT DOCUMENTS

| JP | H0334536 A | 2/1991 |
| JP | 8-335555 H | 12/1996 |
| JP | 2002-316892 A | 10/2002 |
| JP | 2003-517721 A | 5/2003 |
| JP | 2008-044818 A | 2/2008 |
| JP | 2019-196293 A | 11/2019 |
| WO | 0068470 A1 | 11/2000 |
| WO | 2020137804 A1 | 7/2020 |

OTHER PUBLICATIONS

English translation of Written Opinion of the International Searching Authority for corresponding Application No. PCT/JP2020/043681 dated Jan. 26, 2021.
International Search Report for corresponding International Application No. PCT/JP2020/043681 dated Jan. 26, 2021.
Written Opinion of the International Searching Authority for corresponding International Application No. PCT/JP2020/043681 dated Jan. 26, 2021.
Chinese Office Action with partial English translation issued in corresponding Chinese Application No. 202080096102.1 dated Aug. 10, 2023.

* cited by examiner

GALLIUM NITRIDE VAPOR PHASE EPITAXY APPARATUS USED IN VAPOR PHASE EPITAXY NOT USING ORGANIC METAL AS A GALLIUM RAW MATERIAL AND MANUFACTURING METHOD THEREFOR

TECHNICAL FIELD

This application is a national stage filing under 35 U.S.C. § 371 of PCT/JP2020/043681, filed on Nov. 24, 2020 which claims priority to Japanese Patent Application No. 2020-023651 filed on Feb. 14, 2020, the contents of which are hereby incorporated by reference into the present application. The applications are incorporated herein by reference in their entirety. The description herein discloses an art related to a gallium nitride vapor phase epitaxy apparatus and a manufacturing method therefor.

BACKGROUND ART

Compound semiconductor vapor phase epitaxy methods not using organic metal as gallium raw material, such as Halide Vapor Phase Epitaxy (HVPE) and vapor phase epitaxy using gallium vapor as its raw material, are known. In these vapor phase epitaxy methods, carbon does not contaminate grown crystal. A related technique is described in JP 2002-316892 A.

SUMMARY OF INVENTION

Technical Problem

In the vapor phase epitaxy not using organic metal as the gallium raw material such as HVPE, it is difficult to dope magnesium, which is a most useful p-type acceptor. This is because of the difficulty in controlling its supply amount to be constant; for example, when organic metal such as $Cp_2Mg$ is used, this reduces prior to reaction, and when doping is performed using magnesium metal, magnesium evaporates excessively.

Solution to Technical Problem

The description herein discloses a gallium nitride vapor phase epitaxy apparatus that is used in vapor phase epitaxy not using organic metal as a gallium raw material. The apparatus comprises a reactor vessel. The apparatus comprises a wafer holder arranged in the reactor vessel. The apparatus comprises a first raw material gas supply pipe configured to supply a first raw material gas containing gallium into the reactor vessel. The apparatus comprises a second raw material gas supply pipe configured to supply a second raw material gas, which contains nitrogen and configured to react with the first raw material gas, into the reactor vessel. The apparatus comprises a third raw material gas supply pipe configured to supply a third raw material gas containing magnesium into the reactor vessel. The third raw material gas supply pipe is configured capable of placing a magnesium-based oxide on its supply path. The apparatus comprises a first heating unit configured to heat the magnesium-based oxide placed in the third raw material gas supply pipe in a first temperature range.

In the vapor phase epitaxy apparatus disclosed herein, the magnesium-based oxide is heated by the first heating unit in the first temperature range. The magnesium-based oxide thereby reduces, and the third raw material gas containing magnesium can thereby be supplied into the reactor vessel. The magnesium-based oxide is stable and has lower reactivity as compared to magnesium metal. Thus, a magnesium supply amount within the third raw material gas can be controlled to be constant. As a result, magnesium doping can be performed in the vapor phase epitaxy not using organic metal as the gallium raw material.

The magnesium-based oxide may be a single crystal.

The magnesium-based oxide may be magnesium oxide with purity of 99% or higher.

The first temperature range may be a range of 600° C. to 1200° C.

The first raw material gas supply pipe may be configured capable of arranging a solid unit containing gallium on its supply path. The apparatus may further comprise a second heating unit configured to heat the arranged solid unit in a second temperature range of 700° C. to 1200° C.

A hydrogen chloride gas or a chlorine gas may be supplied to inlets of the first raw material gas supply pipe and the third raw material gas supply pipe.

The first raw material gas containing gallium chloride may be discharged from an outlet of the first raw material gas supply pipe.

The third raw material gas containing magnesium chloride may be discharged from an outlet of the third raw material gas supply pipe.

The second raw material gas may be a gas containing ammonia.

Further, a gallium nitride manufacturing method described herein is a gallium nitride manufacturing method using the vapor phase epitaxy not using organic metal as a gallium raw material. The method comprises supplying a first raw material gas containing gallium into a reactor vessel in which a substrate is placed. The method comprises supplying a second raw material gas that contains nitrogen and configured to react with the first raw material gas into the reactor vessel. The method comprises supplying a third raw material gas contains magnesium that was generated using a magnesium-based oxide into the reactor vessel.

DESCRIPTION OF EMBODIMENTS

Configuration of Vapor Phase Epitaxy Apparatus

Figure 1:
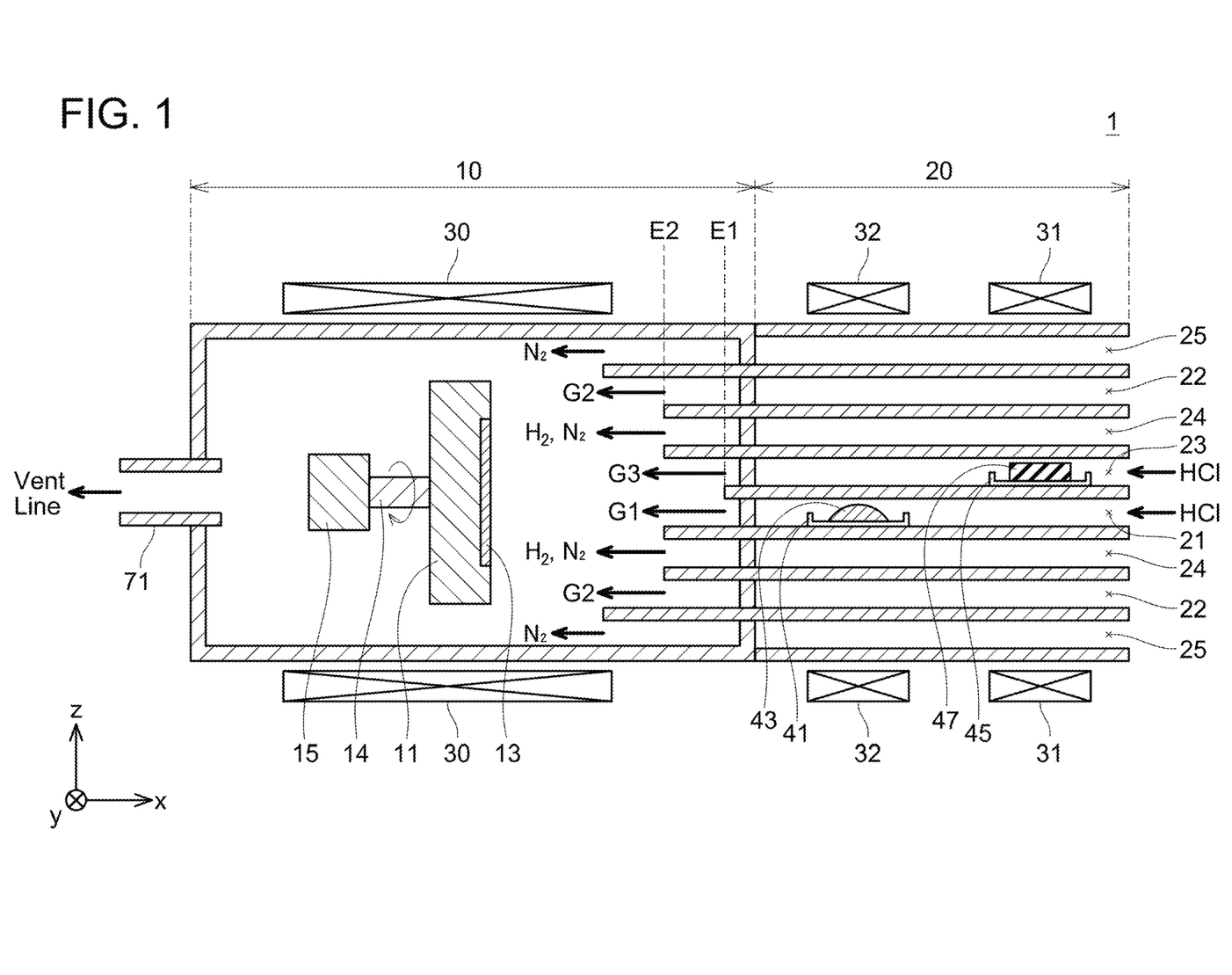
FIG. 1 is a schematic cross-sectional view seeing a vapor phase epitaxy apparatus in a lateral direction.

FIG. 1 shows a schematic cross-sectional view seeing a vapor phase epitaxy apparatus 1 of the present embodiment in a lateral direction. The vapor phase epitaxy apparatus 1 is an example of an apparatus configuration for carrying out HVPE. The vapor phase epitaxy apparatus 1 includes a reactor vessel 10, a raw material gas supply pipe unit 20, and a gas discharge pipe 71.

The reactor vessel 10 has a cylindrical shape. The reactor vessel 10 may be constituted of quartz. A wafer holder 11 is arranged inside the reactor vessel 10. A wafer 13 is held on a wafer holding surface of the wafer holder 11. A rotary shaft 14 is connected to a surface of the wafer holder 11 opposite to the wafer holding surface. An end of the rotary shaft 14 is connected to a driving mechanism 15. Due to this, the wafer holder 11 is configured capable of being rotated and moved in a left-right direction (±x direction) within the reactor vessel 10.

The raw material gas supply pipe unit 20 is connected to the reactor vessel 10. The raw material gas supply pipe unit 20 includes a first raw material gas supply pipe 21, a second raw material gas supply pipe 22, a third raw material gas supply pipe 23, and specific gas supply pipes 24 and 25. The raw material gas supply pipe unit 20 has a cylindrical shape. The second raw material gas supply pipe 22, the specific gas supply pipe 24, the first raw material gas supply pipe 21, and the third raw material gas supply pipe 23 are in a structure of being arranged in this order within the specific gas supply pipe 25. A supply passage of the specific gas supply pipe 25 is defined by a space between an inner wall of the specific gas supply pipe 25 and an outer wall of the second raw material gas supply pipe 22. Similarly, supply passages of the second raw material gas supply pipe 22 and the specific gas supply pipe 24 are defined by spaces between inner and outer walls.

The first raw material gas supply pipe 21 is a pipe configured to supply a first raw material gas G1 containing gallium into the reactor vessel 10. A hydrogen chloride (HCl) gas is supplied to an inlet of the first raw material gas supply pipe 21. A quartz boat 41 in which gallium metal 43 is accommodated is placed on a path in the first raw material gas supply pipe 21. A heater 32 is arranged outside the raw material gas supply pipe unit 20 so as to surround the gallium metal 43. The gallium metal 43 can be heated by the heater 32 in a temperature range of 700° C. to 1200° C. Due to this, gallium chloride can be generated, which can be supplied from an outlet (gas supply port) into the reactor vessel 10 as the first raw material gas G1.

The second raw material gas supply pipe 22 is a pipe configured to supply a second raw material gas G2, which contains nitrogen and is configured to react with the first raw material gas G1, into the reactor vessel 10. Specifically, the second raw material gas G2 is a gas containing ammonia ($NH_3$).

The third raw material gas supply pipe 23 is a pipe configured to supply a third raw material gas G3 containing magnesium into the reactor vessel 10. The hydrogen chloride gas is supplied to an inlet of the third raw material gas supply pipe 23. A quartz boat 45 in which magnesium oxide (MgO) 47 is accommodated is placed on a path in the third raw material gas supply pipe 23. In the present embodiment, the magnesium oxide 47 is a magnesium oxide crystal with purity of 99% or higher. Its specific composition is magnesium oxide (99.9%), aluminum (0.007%), calcium (0.02%), and iron (0.008%). A heater 31 is arranged outside the raw material gas supply pipe unit 20 so as to surround the magnesium oxide 47. The magnesium oxide 47 can be heated by the heater 31 in a temperature range of 600° C. to 1200° C. Due to this, magnesium chloride can be generated, which can be supplied from the outlet (gas supply port) into the reactor vessel 10 as the third raw material gas G3. The magnesium oxide 47 may be placed in a same region as the gallium metal 43, and may be heated simultaneously with the gallium metal 43 by the heater 32.

The heating temperature range of the magnesium oxide 47 will be described. A substance generated by reaction of the magnesium oxide 47 and the hydrogen chloride is primarily $MgCl_2$. Further, it has been found from pre- and post-experiment mass measurements on a MgO raw material that a reaction rate of the hydrogen chloride is about 5% at 900° C. and about 15% at 1200° C. From the above, it can be understood that generation efficiency of the magnesium chloride can be increased with a higher heating temperature of the magnesium oxide 47. That is, an upper limit of the heating temperature of the magnesium chloride is preferably higher within a realistic range. Further, in considering durability of components in the vapor phase epitaxy apparatus 1, about 1200° C., which is a usage upper limit temperature of a general-purpose material such as quartz, is a realistic upper limit. Since reaction of the magnesium oxide and the hydrogen chloride is thermodynamically stable, the heating temperature of the magnesium chloride can be set to a higher temperature than 1200° C. by using a material with higher thermal durability than quartz.

Means for improving the magnesium chloride generation efficiency other than the heating temperature of the magnesium chloride may for example include the following: (1) increasing a surface area by reducing a particle diameter of a bulk single crystal of the magnesium oxide 47 (with a particle diameter range of 1 μm to 1 mm, for example); (2) increasing the surface area by increasing a capacity of the quartz boat 45 being the reactor vessel and thereby increasing an MgO volume; (3) lengthening a reaction time of the magnesium oxide 47 and the hydrogen chloride by reducing a flow speed of the third raw material gas G3 (with a flow speed range of 0.1 to 10 cm/sec, for example); (4) promoting reaction by increasing hermeticity of a space in which the magnesium oxide 47 and the hydrogen chloride react; and (5) using a gas containing chlorine, which has better reactivity with MgO than the hydrogen chloride does.

Further, in the present embodiment, two types of magnesium oxide 47 with different manufacturing methods were used. A first type of magnesium oxide is a bulk single crystal magnesium oxide fabricated from high-purity magnesium metal. The bulk single crystal magnesium oxide is granular, and its particle diameter may for example be in a range of 1 to 10 mm. Single crystal magnesium oxide may be generated for example by electric melting or vapor phase epitaxy (method of subjecting magnesium metal vapor to vapor phase oxidization). The second type of magnesium oxide is powdery magnesium generated by firing, and its particle diameter is smaller than the particle diameter of the bulk single crystal magnesium oxide (with a particle diameter range of 0.1 to 10 μm, for example). Magnesium oxide manufactured by firing magnesium hydroxide may be exemplified as the second type of magnesium oxide. Other examples of the method for generating the second type of magnesium oxide may include: (1) spark discharging; (2) causing oxygen to react with magnesium metal; and (3) causing carbon dioxide gas to react with magnesium carbonate slurry and dissolving the same as hydrogen carbonate, and thereafter firing magnesium carbonate recovered by heat reduction.

A magnesium supply amount supplied from the third raw material gas supply pipe 23 may be controlled by various parameters. For example, when the magnesium supply amount it to be increased, the heating temperature of the magnesium oxide 47 may be increased, the amount of the magnesium oxide 47 placed in the quartz boat 45 may be increased, or a distance between the outlet of the third raw material gas supply pipe 23 and the wafer 13 may be set short. Further, a flow rate of the HCl gas supplied to the first raw material gas supply pipe 21 may be increased.

An end position of a partitioning wall between the first raw material gas supply pipe 21 and the third raw material gas supply pipe 23 on an outlet side (-x direction side) is termed an end E1. Further, an end position of the second raw material gas supply pipe 22 on the outlet side is termed an end E2. The end E1 is a position separated farther away from the wafer 13 than the end E2 is. Due to this, the second raw material gas G2 can be mixed after having mixed the first raw material gas G1 and the third raw material gas G3. That is, reaction with ammonia can be carried out in a state of having mixed the gallium chloride and magnesium chloride in advance. This realizes a state in which magnesium is uniformly doped in the surface of the wafer 13.

The first raw material gas supply pipe 21 and the third raw material gas supply pipe 23 are configured as separate lines. Due to this, a flow rate ratio of the first raw material gas G1 and the third raw material gas G3 can freely be set. Thus, a doping amount of magnesium in the gallium nitride crystal can be adjusted as desired.

The specific gas supply pipes 24 and 25 are pipes configured to supply a specific gas to the reactor vessel 10. The specific gas is a gas that does not contain oxygen and does not react with the first raw material gas G1 and the second raw material gas G2. A specific example of the specific gas may be a gas containing at least one of hydrogen, nitrogen, helium, neon, argon, and crypton. In the present embodiment, a mixed gas of hydrogen and nitrogen is supplied from the specific gas supply pipe 24. Further, a nitrogen gas is supplied from the specific gas supply pipe 25.

A heater 30 is arranged on an outer circumference of the reactor vessel 10 so as to surround the wafer holder 11. The heater 30 is a device configured to heat the wafer 13 by a hot wall structure. Due to this, the wafer 13 can be maintained at a temperature sufficient for gallium nitride crystal growth (1050±50° C.). Further, the raw material gases used for gallium nitride vapor phase epitaxy are discharged to a vent line through the gas discharge pipe 71.

Vapor Phase Epitaxy Method

A method of performing vapor phase epitaxy of the gallium nitride crystal on the wafer 13 by HVPE using the vapor phase epitaxy apparatus 1 will be described. An example of vapor phase growth conditions will be listed. The wafer 13 that is to be a supporting substrate was prepared by growing 3 μm of gallium nitride by MOVPE on a surface of a sapphire substrate. Supply amounts of gallium nitride in the first raw material gas G1 and ammonia in the second raw material gas G2 were set to a mole ratio of 1:20. A pressure in the reactor vessel 10 was set to 1000 hPa. Further, the following conditions were used: growing time: 60 [min], heating temperature for the wafer 13: 1070 [° C.], heating temperature for gallium metal 43: 850 [° C.], heating temperature of magnesium oxide 47: 900 [° C.], hydrogen chloride flow rate in the first raw material gas supply pipe 21: 40 [sccm], hydrogen chloride flow rate in the third raw material gas supply pipe 23: 5.0 [sccm], flow rate of second raw material gas G2 (ammonia): 4 [slm], $H_2/(N_2+H_2)$ ratio: 0.23.

The wafer 13 is heated to 1070° C. by turning on the heater 30. Further, the gallium metal 43 is heated to 850° C. by turning on the heater 32. Then, supply of the first raw material gas G1, the second raw material gas G2, and the specific gas is started. Due to this, an undoped GaN layer 13a (gallium nitride crystal layer in which magnesium is not doped) can be grown on the wafer 13.

When the undoped GaN layer 13a grows to a certain thickness (25 μm), the heater 31 is turned on and the third raw material gas G3 is further supplied. Due to this, an Mg-doped GaN layer 13b (gallium nitride crystal layer in which magnesium is doped) can be grown on the undoped GaN layer 13a. When the Mg-doped GaN layer 13b grows to a certain thickness (0.8 μm), crystal growth is terminated.

SIMS Analysis Result

Figure 2A:
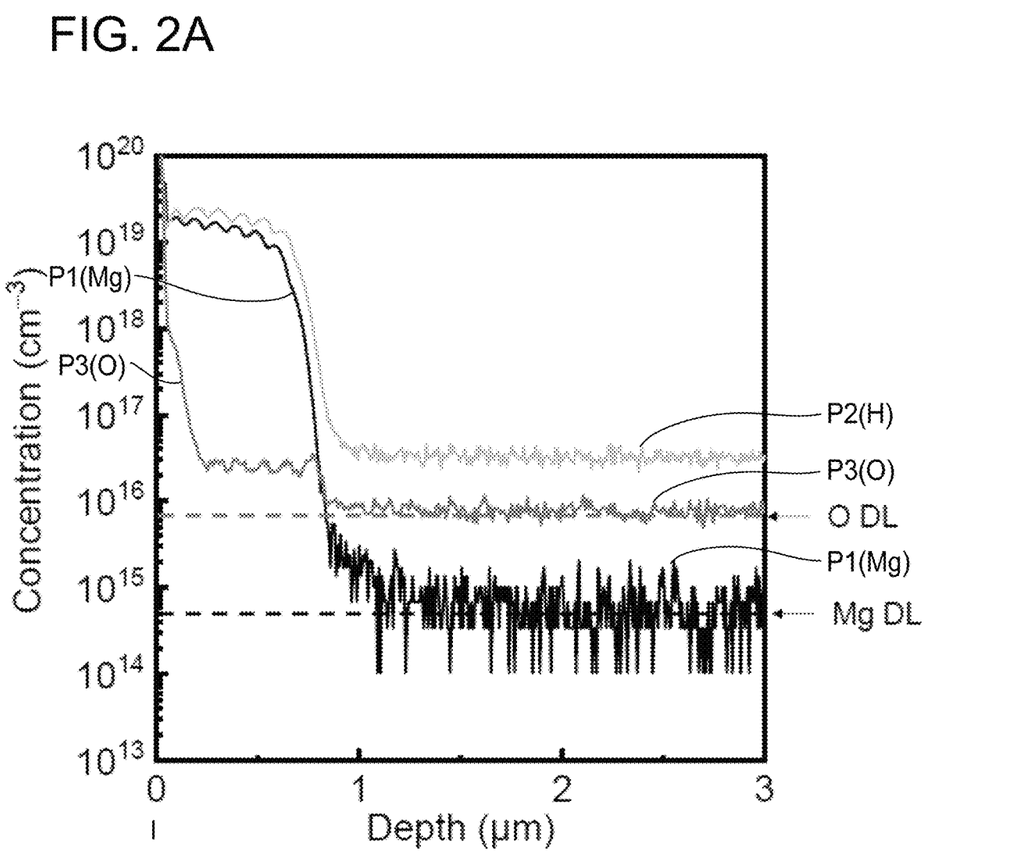
FIG. 2 is a SIMS analysis result and a schematic cross-sectional view of gallium nitride.
Figure 2B:
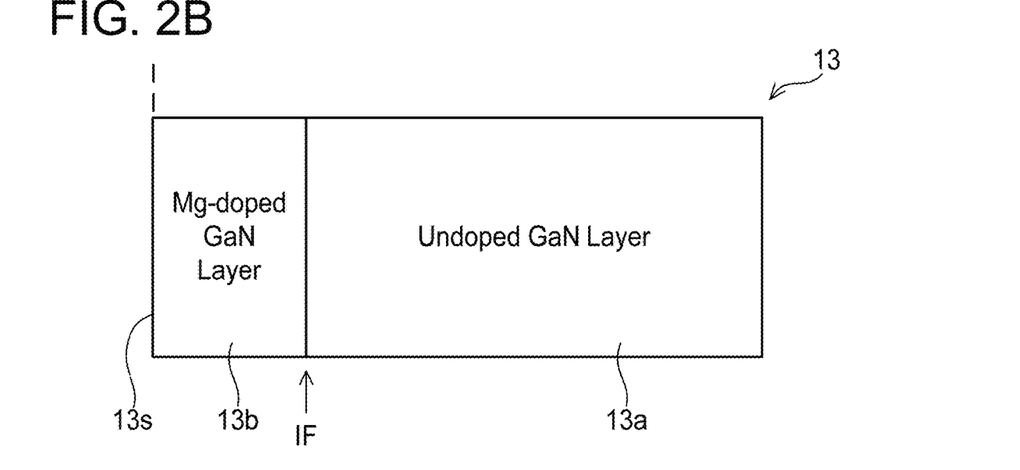

FIG. 2 shows a measurement result obtained by Secondary Ion Mass Spectrometry (SIMS) on the gallium nitride crystal grown by HYPE of the present description. FIG. 2 is the measurement result before annealing. FIG. 2(A) shows depthwise concentration profiles P1 to P3 of magnesium, hydrogen, and oxygen obtained by using SIMS. A vertical axis of FIG. 2(A) is a concentration [atoms/cm$^3$] of each element. A horizontal axis is a depth [μm] from a surface 13s of the Mg-doped GaN layer 13b. FIG. 2(B) is a diagram showing a structure corresponding to FIG. 2(A). As shown in FIG. 2(B), the Mg-doped GaN layer 13b with the thickness of about 0.8 [μm] is disposed on the surface, and the undoped GaN layer 13a is disposed as a lower layer thereof. The magnesium (Mg) concentration of the Mg-doped GaN layer 13b is within a range of $1\times10^{19}$ to $2\times10^{19}$ [atoms/cm$^3$]. On the other hand, the magnesium (Mg) concentration of the undoped GaN layer 13a is equal to or less than Mg_DL which is a measurement detection limit being $5\times10^{14}$ [atoms/cm$^3$]. As such, it can be understood that HVPE of the present description can dope Mg at the concentration that is 10000 times or more the concentration of GaN layer to which Mg is not supplied.

Further, the oxygen (O) concentration in an area excluding a top surface of the Mg-doped GaN layer 13b and vicinity of an interface IF between the Mg-doped GaN layer 13b and the undoped GaN layer 13a will be considered. The oxygen concentration in the Mg-doped GaN layer 13b is in a range of $2\times10^{16}$ to $3\times10^{16}$ [atoms/cm$^3$]. This is a low value that is about 1/1000 of the Mg concentration of the Mg-doped GaN layer 13b. Further, an oxygen detection limit O_DL is $7\times10^{15}$ [atoms/cm$^3$]. According to the above, it can be understood that the concentration of oxygen that is doped in the Mg-doped GaN layer 13b can be suppressed sufficiently low, at a level close to the detection limit even in a case of using magnesium oxide with high content of oxygen (with a ratio of oxygen and Mg of 1:1). Since oxygen serves as a donor in the gallium nitride crystal, the gallium nitride can be fabricated to be of a p type by reducing a doping concentration of oxygen.

In FIG. 2, the concentration profile P1 of magnesium and the concentration profile P2 of hydrogen are in almost identical patterns. From this, it can be understood that magnesium and hydrogen bond at 1:1 and are doped in the gallium nitride crystal. It is known that activation of magnesium is inhibited in a state where hydrogen is bonded with Mg in p-type gallium nitride. For example, in Metal Organic Vapor-Phase Epitaxy (MOVPE), even p-type gallium nitride grown by using cyclopentadienyl magnesium (Cp2Mg) contains hydrogen at the same concentration as magnesium and hydrogen is bonded with Mg, thus dehydrogenation treatment is necessary for magnesium activation. This indicates that Mg is taken into the gallium nitride crystal as an acceptor necessary for a p-type semiconductor. As described above, the art described herein enables the Mg concentration and H concentration in the p-type gallium nitride to be at the same level, and thus can be said as having equaling quality as Mg-doped gallium nitride grown by MOVPE.

Photoluminescence Measurement Result

Figure 3:
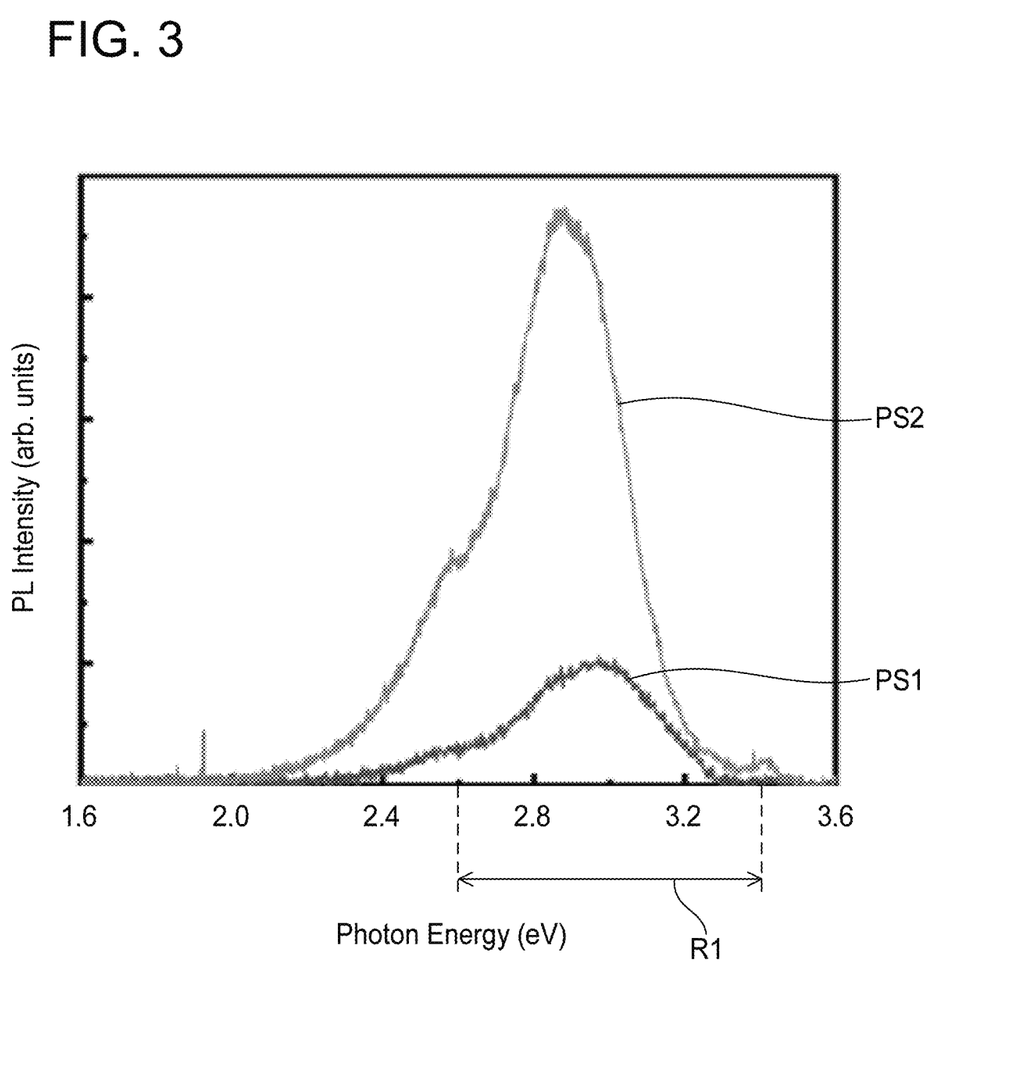
FIG. 3 is a photoluminescence (PL) spectrum diagram.

FIG. 3 shows room-temperature photoluminescence (PL) spectra PS1 and PS2 of the gallium nitride crystal grown by HVPE described in the present specification. A horizontal axis is photon energy [eV] and a vertical axis is PL intensity [arbitrary unit]. He—Cd laser (wavelength: 325 nm) is used as an excitation light source. The PL spectrum PS1 is a result of having measured the Mg-doped GaN layer 13b prior to the annealing. The PL spectrum PS2 is a post-annealing measurement result. The annealing was carried out under the conditions of nitrogen atmosphere at 700° C. for 5 minutes.

A range R1 of the photon energy 2.6 to 3.4 [eV] is a range in which donor acceptor pair light emission took place, which indicates that magnesium was activated as the acceptor. The PL spectrum PS1 has its peak value in the range R1. As such, it can be understood that the doped magnesium is located in a gallium site and has excellent crystallinity. Further, from a comparison of the PL spectra PS1 and PS2, the PL intensity of the donor acceptor pair light emission is enhanced by the annealing. Due to this, it can be understood that a p-type impurity (Mg) activation rate can be increased by the annealing.

Hall Effect Measurement Result

A Hall effect measurement was carried out on the Mg-doped GaN layer 13b. Since a specific measurement method is well known, explanation thereof will be omitted. As a result of having measured the Mg-doped GaN layer 13b, the following information was obtained. Conduction type: p-type, carrier concentration ($cm^{-3}$): $1.3 \times 10^{17}$, mobility ($cm^2$/Vsec): 9.

Further, from a temperature dependency of a carrier concentration, the activation energy was estimated as 195 [meV]. This activation energy is at about the same level as that of p-type gallium nitride fabricated by MOVPE. As such, by the art disclosed herein, it can be understood that p-type gallium nitride having equaling performance as that by MOVPE can be vapor-deposited by HVPE.

Manufacturing Method Dependency of Magnesium Oxide 47

Ability to vapor-deposit p-type gallium nitride was same for a case of using the first type of magnesium oxide (single crystal magnesium oxide) and a case of using the second type of magnesium oxide (magnesium oxide manufactured by firing magnesium hydroxide). However, it has been found that use of the first type of magnesium oxide resulted in a better surface morphology of the grown crystal. As such, the first type of magnesium oxide (single crystal magnesium oxide) is considered as being preferable as a Mg dopant raw material for gallium nitride, and a single crystal of magnesium oxide fabricated by a method other than thermal reduction of magnesium hydroxide is considered as being preferable. This is assumed as being due to the first type of magnesium oxide having higher surface activity than the second type of magnesium oxide. This will be described hereinbelow.

The second type of magnesium oxide forms a stable surface structure with compounds such as absorbed carbonates upon its manufacture (firing), thus its surface becomes inert (stable). The second type of magnesium oxide has a lower impurity concentration with a higher firing temperature, however, this results in increased surface inertness. Due to this, it is difficult to efficiently react with the HCl gas.

On the other hand, the first type of magnesium oxide is less likely to form a stable structure on its surface as compared to the second type of magnesium oxide. Due to this, its surface can be activated by easily removing moisture and carbon dioxide absorbed in the surface (purification) by a pretreatment at about 600° C. Due to this, since the first type of magnesium oxide can efficiently react with the HCl gas, it becomes possible to increase controllability of the magnesium chloride concentration contained in the third raw material gas. As a result of this, its surface morphology can be improved.

Effects n-type gallium nitride substrates and semi-insulative gallium nitride substrates are sold on market. However, manufacture of p-type gallium nitride substrates has not even been established. If p-type gallium nitride substrates can be fabricated, degree of freedom in designing various devices would be increased and performance improvement becomes possible, thus realization of the fabrication is in demand. Further, since vapor phase epitaxy such as HVPE that does not use organic metal as a gallium raw material has advantages in its fast growing speed and its nature of being able to avoid carbon contamination that occurs in MOVPE, thus it is used not only for conventional bulk crystal growth but also as a method for fabricating epitaxial layers in power devices. Especially, for growing a drift layer that requires carrier concentration control at a low concentration level and a film thickness of 10 micrometers or more, HVPE is an extremely useful means. However, with HVPE, it is difficult to dope magnesium, which is the most useful as the p-type acceptor. This is due to issues in doping using magnesium metal that magnesium evaporates excessively and thus its supply amount cannot be controlled to be constant and that controllability and productivity cannot be ensured due to reaction that occurs with members in a furnace such as quartz, which result in incapability of obtaining crystals in excellent condition. Further, it is because issues that occur when doping is carried out using organic metal such as $Cp_2Mg$, such as reduction that occurs prior to reaction and carbon atom contamination.

In view of the foregoing, the vapor phase epitaxy apparatus 1 of the present disclosure dopes magnesium using magnesium oxide. That is, the third raw material gas G3 containing magnesium can be supplied into the reactor vessel by heating magnesium oxide using the heater and thereby thermally reducing the same. Magnesium oxide is stable and has low reactivity as compared to magnesium metal. As such, the magnesium supply amount in the third raw material gas G3 can be controlled to be constant. As a result, p-type gallium nitride with excellent crystallinity can be grown using HVPE.

Modification

An embodiment of the present invention has been described in detail with reference to the drawings, however, this is a mere exemplary indication and thus does not limit the scope of the claims. The art described in the claims includes modifications and variations of the specific examples presented above.

The magnesium oxide 47 is not limited to high-purity MgO. So long as it is magnesium-based oxide, it may contain other elements and compounds. It is preferable to contain element(s) that do not serve as a donor element for gallium nitride.

A magnesium supply source is not limited to magnesium oxide. For example, it may be another magnesium compound such as magnesium chloride or magnesium nitride. Magnesium chloride and magnesium nitride easily react with moisture in air and are unstable, thus their handling is difficult compared to magnesium oxide. This other magnesium compound preferably is a compound not containing oxygen, which is a donor element.

The gas supplied to the inlet of the first raw material gas supply pipe 21 is not limited to the hydrogen chloride (HCl) gas. It may be any gas so long as the gas can cause the first raw material gas G1 to contain gallium. For example, a chlorine ($Cl_2$) gas may be supplied to the inlet. The gas supplied to the inlet of the third raw material gas supply pipe 23 is not limited to the hydrogen chloride (HCl) gas. It may be a gas containing Cl such as the chlorine ($Cl_2$) gas, or a gas containing other halogen element(s) such as F and Br. Alternatively, it may be a gas containing hydrogen ($H_2$) or hydrogen atom (H), such as MgH and $MgH_2$.

The scope to which the art disclosed herein is applicable is not limited to gallium nitride. The art herein may be applied to crystal growth in various compound semiconductors capable of using magnesium as impurity. For example, it may be applied to AlGaN (aluminum-gallium nitride), AN (aluminum nitride), InN (indium nitride), InGaN (indium-gallium nitride), or mixed crystals thereof.

The numbers and arrangements of the first to third raw material gas supply pipes 21 to 23 described herein are mere examples, and no limitation is made to the above configuration. For example, the first raw material gas supply pipe 21 and the third raw material gas supply pipe 23 may be integrated.

The heating temperatures of the wafer 13, the gallium metal 43, and the magnesium oxide 47 are mere examples. For example, the wafer 13 may be heated in a range of 1050° C.±100° C.

The case in which the first raw material gas G1 contains gallium chloride was explained, however, no limitation is made to this configuration. The first raw material gas G1 may be a gas containing any chemical composition so long as it is a gas containing gallium. For example, the first raw material gas G1 may be a gas containing gallium trichloride ($GaCl_3$). Alternatively, the first raw material gas G1 may be a gas containing single gallium.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

1: Vapor Phase Epitaxy Apparatus
10: Reactor Vessel
11: Wafer Holder
13: Wafer
20: Raw Material Gas Supply Pipe Unit
21: First Raw Material Gas Supply Pipe
22: Second Raw Material Gas Supply Pipe
23: Third Raw Material Gas Supply Pipe
30 To 32: Heater
G1: First Raw Material Gas
G2: Second Raw Material Gas
G3: Third Raw Material Gas

The invention claimed is:

1. A gallium nitride vapor phase epitaxy apparatus used in vapor phase epitaxy not using organic metal as a gallium raw material, the apparatus comprising:
a reactor vessel;
a wafer holder arranged in the reactor vessel;
a first raw material gas supply pipe configured to supply a first raw material gas containing gallium into the reactor vessel;
a second raw material gas supply pipe configured to supply a second raw material gas, which contains nitrogen and configured to react with the first raw material gas, into the reactor vessel;
a third raw material gas supply pipe configured to supply a third raw material gas containing magnesium into the reactor vessel, the third raw material gas supply pipe configured to have a magnesium-based oxide on its supply path; and
a first heating unit configured to heat the magnesium-based oxide placed in the third raw material gas supply pipe in a first temperature range.

2. The gallium nitride vapor phase epitaxy apparatus according to claim 1, wherein the magnesium-based oxide is a single crystal.

3. The gallium nitride vapor phase epitaxy apparatus according to claim 1, wherein the magnesium-based oxide is magnesium oxide with purity of 99% or higher.

4. The gallium nitride vapor phase epitaxy apparatus according to claim 1, wherein the first temperature range is a range of 600° C. to 1200° C.

5. The gallium nitride vapor phase epitaxy apparatus according to claim 1, wherein
the first raw material gas supply pipe is configured capable of arranging a solid unit containing gallium on its supply path, and
the gallium nitride vapor phase epitaxy apparatus further comprises a second heating unit configured to heat the arranged solid unit in a second temperature range of 700° C. to 1200° C.

6. The gallium nitride vapor phase epitaxy apparatus according to claim 1, wherein
a hydrogen chloride gas or a chlorine gas is supplied to inlets of the first raw material gas supply pipe and the third raw material gas supply pipe,
the first raw material gas containing gallium chloride is discharged from an outlet of the first raw material gas supply pipe, and
the third raw material gas containing magnesium chloride is discharged from an outlet of the third raw material gas supply pipe.

7. The gallium nitride vapor phase epitaxy apparatus according to claim 1, wherein the second raw material gas is a gas containing ammonia.

8. A gallium nitride manufacturing method using vapor phase epitaxy not using organic metal as a gallium raw material, the method comprising:
supplying a first raw material gas containing gallium into a reactor vessel in which a substrate is placed;
supplying a second raw material gas that contains nitrogen and configured to react with the first raw material gas into the reactor vessel; and
supplying a third raw material gas contains magnesium that was generated using a magnesium-based oxide into the reactor vessel.

9. The gallium nitride manufacturing method according to claim 8, wherein the magnesium-based oxide is a single crystal.

10. The gallium nitride manufacturing method according to claim 8, wherein the magnesium-based oxide is magnesium oxide with purity of 99% or higher.

11. The gallium nitride manufacturing method according to claim 8, wherein the third raw material gas is a gas obtained by heating the magnesium-based oxide in a range of 600° C. to 1200° C.

12. The gallium nitride manufacturing method according to claim 8, wherein the first raw material gas is a gas obtained by heating a solid unit containing gallium in a range of 700° C. to 1200° C.

13. The gallium nitride manufacturing method according to claim 8, wherein the first raw material gas is a gas containing gallium chloride, the second raw material gas is a gas containing ammonia, and the third raw material gas is a gas containing magnesium chloride.

* * * * *